US009437753B2

(12) United States Patent
Ballif

(10) Patent No.: US 9,437,753 B2
(45) Date of Patent: Sep. 6, 2016

(54) DEVICE COMPRISING ELECTRICAL CONTACTS AND ITS PRODUCTION PROCESS

(75) Inventor: Christophe Ballif, Neuchatel (CH)

(73) Assignee: ECOLE POLYTECHNIQUE FEDERALE DE LAUSANNE (EPFL) EPFL-TTO, Lausanne (CH)

( * ) Notice: Subject to any disclaimer, the term of this patent is extended or adjusted under 35 U.S.C. 154(b) by 834 days.

(21) Appl. No.: 13/501,177

(22) PCT Filed: Oct. 11, 2010

(86) PCT No.: PCT/EP2010/065225
§ 371 (c)(1),
(2), (4) Date: May 31, 2012

(87) PCT Pub. No.: WO2011/045287
PCT Pub. Date: Apr. 21, 2011

(65) Prior Publication Data
US 2012/0240998 A1    Sep. 27, 2012

(30) Foreign Application Priority Data

Oct. 13, 2009  (EP) .................................. 09172876

(51) Int. Cl.
*H01L 31/0224*    (2006.01)
*H01L 31/05*    (2014.01)

(52) U.S. Cl.
CPC ... *H01L 31/022425* (2013.01); *H01L 31/0224* (2013.01); *H01L 31/022433* (2013.01); *H01L 31/05* (2013.01); *H01L 31/0508* (2013.01); *Y02E 10/50* (2013.01)

(58) Field of Classification Search
CPC .................. H01L 31/0224; H01L 31/022425; H01L 31/022408; H01L 31/022416; H01L 31/022433; H01L 31/05; H01L 31/0504; H01L 31/0508; H01L 31/512
See application file for complete search history.

(56) References Cited

U.S. PATENT DOCUMENTS 4,281,208 A * 7/1981 Kuwano et al. ............... 136/249
4,612,409 A * 9/1986 Hamakawa et al. .......... 136/244
(Continued)

FOREIGN PATENT DOCUMENTS

EP    1 737 037 A2    12/2006
EP    2 068 354 A2    6/2009
(Continued)

OTHER PUBLICATIONS

European Search Report, dated Mar. 18, 2010, from corresponding European application.
(Continued)

*Primary Examiner* — Allison Bourke
*Assistant Examiner* — Edward Schmiedel
(74) *Attorney, Agent, or Firm* — Young & Thompson

(57) ABSTRACT

A device includes a conductive surface (12) and electrical contacts (14) by which an electric current is able to be passed. The electrical contacts (14) include conductive seeds (16) deposited on the conductive surface (12), an electrically insulating layer (18), which covers discontinuously the conductive seeds (16) in order to form openings leaving access to the conductive seeds (16), and a plating layer (22) recovering the discontinuous insulating layer (18) and deposited on conductive seeds (16) which are accessible through the openings and form points from which the deposit of the plating layer (22) can start. The rest of the conductive surface (12), which doesn't include any electrical contacts (14), is continuously covered by the electrically insulating layer (18).

8 Claims, 3 Drawing Sheets

(56) References Cited

U.S. PATENT DOCUMENTS

| | | | |
|---|---|---|---|
| 4,872,925 A * | 10/1989 | McMaster | 136/244 |
| 6,051,493 A * | 4/2000 | Tarte et al. | 438/662 |
| 6,069,313 A * | 5/2000 | Kay | 136/249 |
| 6,307,146 B1 * | 10/2001 | Takeuchi et al. | 136/258 |
| 6,340,633 B1 | 1/2002 | Lopatin et al. | |
| 6,482,656 B1 | 11/2002 | Lopatin | |
| 6,515,218 B1 * | 2/2003 | Shimizu | H01L 31/0512 136/244 |
| 2003/0047444 A1 * | 3/2003 | Boxman et al. | 204/192.38 |
| 2005/0034755 A1 * | 2/2005 | Okada et al. | 136/256 |
| 2005/0140013 A1 | 6/2005 | Ueno | |
| 2009/0078307 A1 * | 3/2009 | Segawa et al. | 136/252 |
| 2009/0120494 A1 * | 5/2009 | Moon et al. | 136/256 |
| 2009/0239331 A1 * | 9/2009 | Xu et al. | 438/98 |
| 2010/0059117 A1 * | 3/2010 | Shi et al. | 136/258 |

FOREIGN PATENT DOCUMENTS

| | | | |
|---|---|---|---|
| EP | 2 105 969 A2 | | 9/2009 |
| GB | 2 451 497 A | | 2/2009 |
| WO | WO 2008/098407 | * | 8/2008 |

OTHER PUBLICATIONS

International Search Report, dated Feb. 2, 2011, from corresponding PCT application.

* cited by examiner (Prior Art)

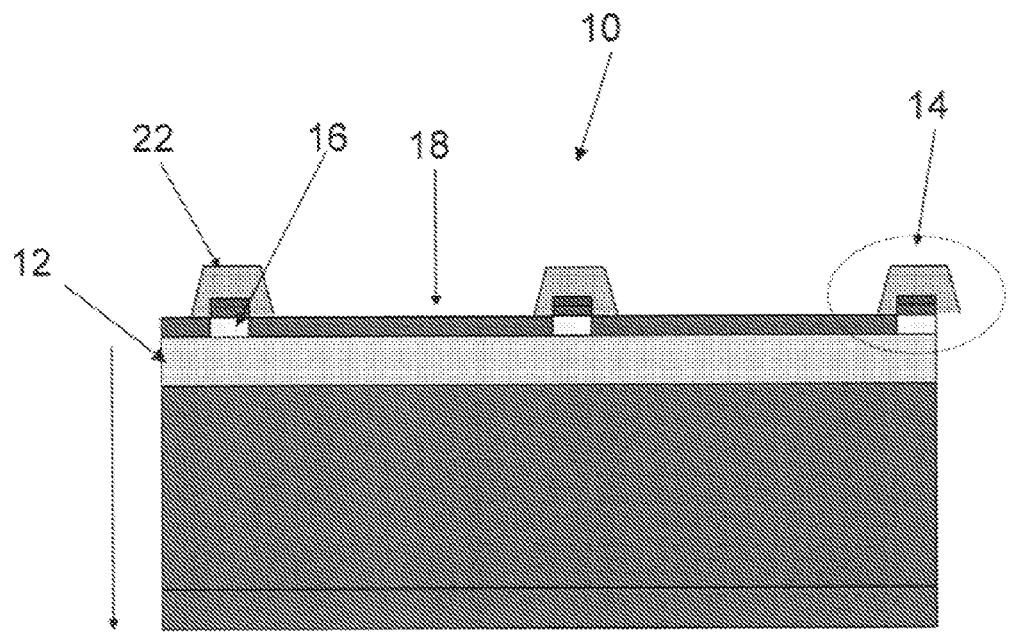
FIG. 3
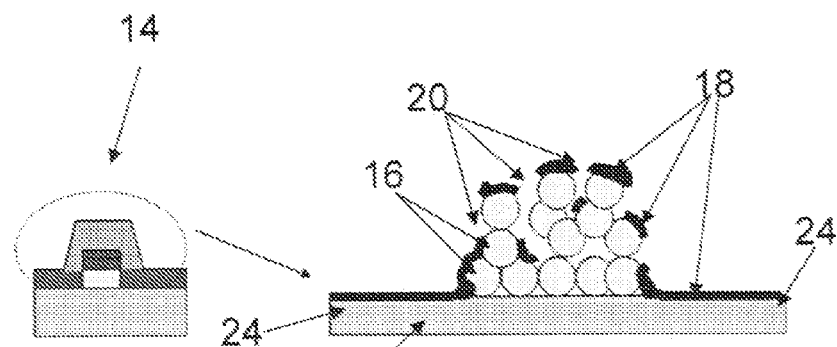
FIG. 4a
FIG. 4b
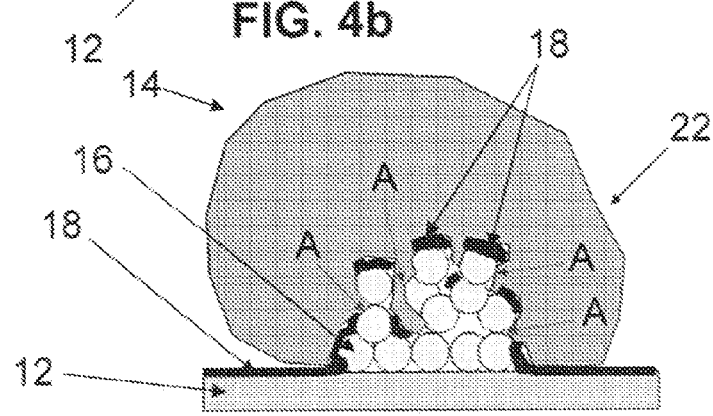
FIG. 4c (Prior Art)

DEVICE COMPRISING ELECTRICAL CONTACTS AND ITS PRODUCTION PROCESS

TECHNICAL FIELD

The invention relates to a device comprising a conductive surface and electrical contacts by which an electric current is able to be passed. The invention refers also to a method for producing such device. It finds in particular advantageous application for the solar cell electrical contacts fabrication.

BACKGROUND OF THE INVENTION

Photovoltaic solar cells have to extract high current densities, in the range of 10 to 50 mA/cm$^2$ of current per unit area perpendicular to the solar illumination. Such a device is illustrated in FIG. 1 in a cross-sectional view. The generated photocurrent is usually collected and transported laterally through a conductive front layer 1, such as a highly doped region of silicon, a thin transparent metallic layer, or a transparent conductive oxide such as SnO$_2$, ITO, ZnO, InO:H (Indium oxide) or a combination of those. Eventually the current is collected by more conductive contact lines called fingers or grid contacts 2. FIG. 5 shows a typical metal grid pattern placed on a front side of a photovoltaic solar cell. Busbars 3 are usually contacted (soldered, welded or contacted with electrical glue) with a highly conductive metal string to extract the current that is generated homogeneously over the optically active area (i.e. not covered by the contact grid) and collected by the thin fingers or grid contact 2. These grid contacts are often deposited using the screen-printing of conductive paste, such as silver containing paste.

If the screen-printed contacts are realized only by screen-printing or related techniques (e.g. stencil printing), using a single or a double print, they tend to be wide (70-120 μm), thereby shadowing the solar cells and creating optical losses, as typically 4-11% of the surface of the solar cell is then covered by a reflective material (meaning area where no photon can be collected). Also the bulk electrical resistivity of the screen-printed paste (typically Ag flakes with inorganic and organic components) is significantly higher than the one of the corresponding bulk material. In the case of Ag, the resistivity for a paste which is cured at high temperature) (700-900°) is a factor 2-3 higher than the one of bulk Ag, and 7-10 higher in the case of pastes cured at low temperature (150-300°). This low conductivity can lead to strong electrical losses in the contact fingers of the photovoltaic solar cell. In order to compensate for the low conductivity, thick fingers have to be printed (typically several tens of micrometers). The disadvantage is that it can still be insufficient and still produces electrical losses, and, in addition, there is the need to use large quantity of screen-printed paste, which can be an expensive component.

As shown by FIG. 2, one possibility to limit both the optical losses, the electrical losses and to save material, would be to deposit on the conductive front layer 1, by screen-printing or another technique, a thinner seed-line 4, and subsequently to reinforce the electrical contact by a plating process (electroless plating, or electroplating), typically using Ag, Cu, Ni and other layers for plating the contacts. The advantage of plated material 5 is a higher conductivity, closer to the bulk conductivity of the used materials.

The problem is that, in the proposed configuration, both the seed-line or grid contact 4, and the underlying layer 1 are conductive. Hence the materials 5 deposited by plating will tend to also deposit on both the seed-line 4 and the underlying layer 1, or at least partially on the underlying layer 1. This will then lead to undesired metal coverage of the cell front surface, leading to optical losses. It is possible to work by varying the composition of the plating solutions to achieve a "selectivity" between the finger contacts 4 and the underlying layer 1, but it will also be difficult to warrant a robust process in any production, because in principle all conductive layers will be able to give or accept the electrons needed in the plating process (and furthermore with electroplating).

One object of the present invention is to provide a device, such as a solar cell, which allows to avoid the disadvantages of the prior art. More specially, one object of the invention is to provide a device comprising a conductive surface and electrical contacts, said electrical contacts having a reduced size and an increased conductivity.

SUMMARY OF THE INVENTION

The present invention relates to a device comprising a conductive surface and electrical contacts by which an electric current is able to be passed. According to the invention, said electrical contacts comprise conductive seeds deposited on the conductive surface, an electrically insulating layer, which covers discontinuously said conductive seeds in order to form openings leaving access to said conductive seeds, and a plating layer recovering said discontinuous insulating layer and deposited on conductive seeds which are accessible through said openings and form points from which the deposit of said plating layer can start. Moreover, the rest of the conductive surface, which doesn't comprise any electrical contacts, is continuously covered by said electrically insulating layer.

Preferably, the conductive seeds contain silver.

In some embodiments, the electrically insulating layer may be optically transparent.

Advantageously, the electrically insulating layer may comprise one layer or a stack of layers made of materials selected from the group consisting of MgF and other optically transparent Fluor compounds, SiN$_x$, SiO$_2$, TiO$_2$, Al$_2$O$_3$, ZnS, and SiO$_x$N$_y$. An undoped transparent conductive oxide based on ZnO, SnO$_2$, or InO can also be used.

Preferably, the plating layer may be made of a material selected from the group consisting of Ag and Cu.

According to a preferred embodiment, the electrical contacts form a pattern designed for current collection, such as a grid.

Advantageously, the device of the invention is a solar cell, more particularly a silicon heterojunction solar cell.

The present invention relates also to a method for producing a device as defined above, and comprising the steps of:
  providing a conductive surface,
  depositing, on said conductive surface, conductive seeds in places corresponding to the positions of the electrical contacts,
  depositing an electrically insulating layer on the full conductive surface in order to form a discontinuous electrically insulating layer in the region of the conductive seeds and to provide, in said discontinuous insulating layer, openings leaving access to said conductive seeds and in order to form a continuous electrically insulating layer on the rest of the conductive surface, recovering the discontinuous electrically insulating layer and conductive seeds which are accessible through said openings with a plating layer, said plating layer starting to grow from said conductive seeds accessible through said openings, such conductive seeds forming points to start the deposit of the said plating layer.

Advantageously, the conductive seeds may be formed by depositing a conductive paste having the appropriate roughness and porosity allowing the growth of the plating layer.

Preferably, the paste may be deposited by a method selected from the group consisting of screen-printing, stencil printing, aerosol, syringe and inkjet printing, to form a pattern suitable for current collection from the device, such as a grid.

The present invention relates also to the use of the method defined above for producing a solar cell, and more particularly a silicon heterojunction solar cell comprising for example electrical contacts forming a metal pattern on its front side.

BRIEF DESCRIPTION OF THE DRAWINGS

FIG. 3 is a schematic cross-section view of a solar cell of the invention, FIGS. 4a, 4b, 4c represent the different steps of the method of the invention.

DETAILED DESCRIPTION

Figure 1:
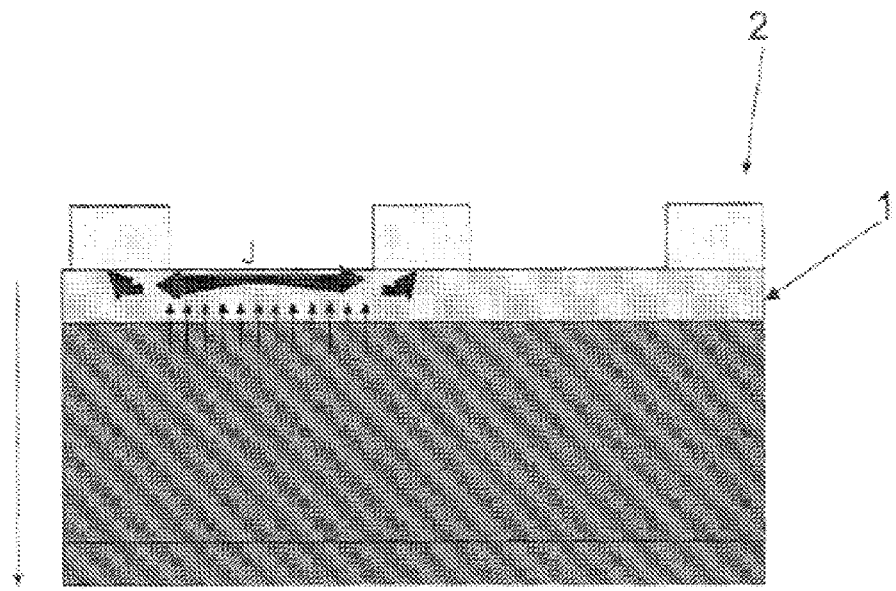
FIGS. 1 and 2 are schematic cross-section views of solar cells of the prior art.
Figure 2:
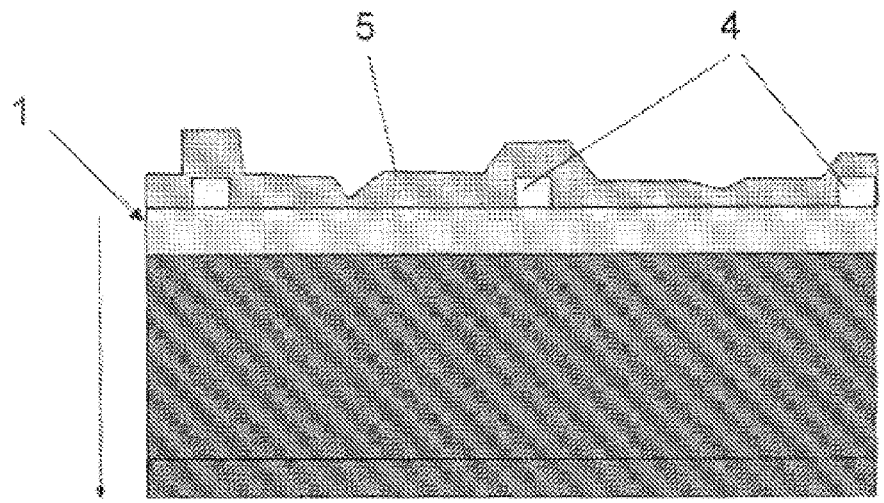

As shown by FIGS. 3 and 4a to 4c, a device of the invention, such as a solar cell 10, comprises a conductive surface 12 and electrical contacts 14 by which an electric current is able to be passed. According to the invention, each electrical contact 14 comprises:

conductive seeds 16 deposited on the conductive surface 12, an electrically insulating layer 18, which covers discontinuously said conductive seeds 16 in order to form openings 20 leaving access to said conductive seeds 16, and a plating layer 22 recovering said discontinuous insulating layer 18 and deposited on conductive seeds 16 which are accessible through said openings 20 and form points A from which the deposit of said plating layer 22 can start.

Moreover, the rest of the conductive surface 12, which doesn't comprise the electrical contacts 14, is continuously covered by said electrically insulating layer 18.

According to the invention, the device comprises a discontinuous electrically insulating layer integrated into each electrical contact. Such device is a conductive device since the electrical contact, comprising electrically insulating parts, comprises also conductive seeds and a plating layer linking said electrically insulating parts but also said conductive seeds, and consequently the conductive surface, since the conductive seeds are deposited on said conductive surface.

According to the method of the invention, first are deposited fine contact lines of conductive seeds 16, called fingers or grid contacts. In this example, the contact lines form a grid. It is obvious that the grid can be replaced with any appropriate pattern, suitable for current collection from the solar cell. The lateral dimension of the fingers is 10-50 μm. To obtain the conductive seeds 16, a conductive paste is used. This conductive paste contains typically silver flakes or nanoparticles or silver containing particles. Such paste has sufficient roughness and porosity, such as typically obtained by screen-printing, or inkjet printing or dispensing of pastes containing micro- and nano-particles. This seed-layer can be thin, only a few micrometer, and constitute the conductive seeds 16 for the grid contacts.

Then an electrically insulating (insulating with respect to the underlying conductive front layer 18, i.e. with at least a resistivity of a factor 100 higher) and optically transparent layer in the absorption range of the solar cells (typical absorption below 1-5% in the range of interest), such as MgF, $SiN_x$, $SiO_2$, $SiO_xN_y$, $TiO_2$, ZnS or $Al_2O_3$ or a multi-stack layer of these materials is deposited on the full front side of the device, by any techniques such as sputtering, evaporation, chemical vapor deposition, plasma enhanced chemical vapor deposition. As shown by FIG. 4b, the deposition is such that parts of the conductive seeds 16 are not fully covered, i.e. the deposited layer 18 is discontinued on the conductive seeds or the fine-line grid contacts 16 in order to form openings 20 leaving access to the conductive seeds 16. However, the other "optically active areas" 24 of the cells are covered by the electrical insulating layer 18.

Figure 5:
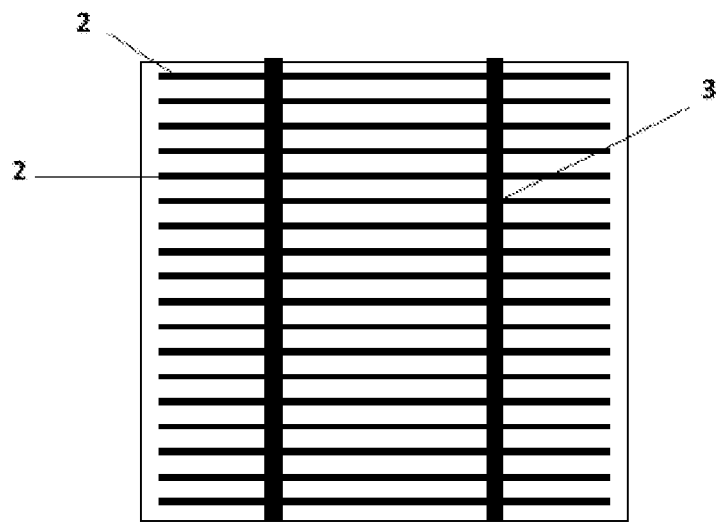
FIGS. 5 and 6 are schematic top views of a solar cell of the prior art and a solar cell of the invention, respectively.
Figure 6:
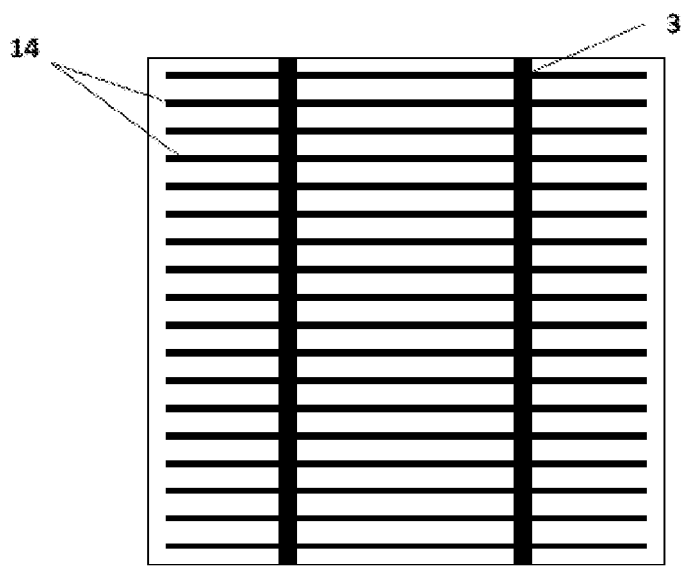

In the last step, the plating process takes place. Thanks to the electrically insulating layer 18 covering the "optically active areas" 24, and thanks to the remaining openings 20 in the conductive seeds or grid contacts 16 not covered by the insulating layer 18, the plating can start only on the grid contacts, as no plating will occur where there is an insulating layer, because it requires an electrical current to flow, especially in the case of electroplating. The selectivity of the plating process is optimum and the electrical conductivity of the grid contacts can be enhanced by the plating, as shown in FIG. 4c. The grid contact finger can then be thickened by several micrometers or tens of micrometers of highly conductive material. At the end of the process, a device is obtained, which comprises electrical contacts 14 which have a reduced size and an increased conductivity compared to the known metal grid pattern. FIG. 6 shows that the electrical contacts 14 are not as wide as the typical electrical contacts 2 shown by FIG. 5.

The choice of the insulating layer 18 is important. It should be thick enough in order to have no pinholes or discontinuity when deposited on the optically active area of the device, or at least sufficiently compact to prevent deposition of metal.

If the device that has to be metalized with thin highly conductive lines does not need to capture light, then the insulating layer 18 does not need to be optically transparent.

The invention can also be used advantageously for the backside of solar cells or for solar cells where the front metallization pattern is brought to back of the solar cells using holes in the wafers such as in metallization wrap through cells and both electrical contacts are then at the backside of the cell.

More generally, the invention allows the strengthening of electrical contacts of any shapes on any conductive surface (including metallic), providing the rough seed-layer is present and the application technique for deposited the rough seed-layer is well chosen.

Moreover, by choosing the deposited layers with the proper refractive index, between 1.3 and 2.4, or a multi-stack of such materials, depending on the refractive index of the material covering the cell in a module (typically a polymer based encapsulant) and of the conductive front layers and underlying layers, it is possible to achieve an additional anti-reflection effect of the solar cells, which can lead to an additional current gain of several percent.

The present invention is particularly interesting when it applies to so-called silicon heterojunction solar cell, using a thin (2-10 nm) intrinsic amorphous Si layers between the crystalline wafer end the doped layers. Such cells are covered by a transparent conductive oxide, as ITO, ZnO or $SnO_2$, or indium oxide doped with H, at the front and sometimes at the back. As the cell is fabricated at around 200° C., it cannot withstand high annealing temperature above 270-300° C. In this case, the process of the invention applies particularly well, as no "high-temperature" metallization paste can be applied.

The invention claimed is:

1. A solar cell comprising:
   a conductive surface; and
   electrical contacts by which an electric current is able to be passed, the electrical contacts comprising
      conductive seeds including a first plurality of conductive seeds and a second plurality of conductive seeds, the conductive seeds deposited on the conductive surface as a pattern of contact lines, the conductive seeds being made of a conductive paste containing particles
      an electrically insulating layer discontinuously covering said conductive seeds forming openings leaving access to said conductive seeds, the electrically insulating layer directly covering a portion of each of the first plurality of conductive seeds, a remaining portion of each of the first plurality of conductive seeds corresponding to said openings in said electrically insulating layer are not directly covered by the electrically insulating layer, the second plurality of conductive seeds are not directly covered by the electrically insulating layer, and
      a plating layer covering said electrically insulating layer and deposited on the conductive seeds accessible through said openings, wherein the remaining portion of each of the first plurality of conductive seeds is in contact with said plating layer conductive seeds,
      the conductive surface, the conductive seeds, and the plating layer being in electrical contact, the conductive seeds being in electrical contact with the plating later, the plating layer being in electrical contact with the conductive surface,
   wherein a portion of the conductive surface that does not include any of the electrical contacts is continuously covered by said electrically insulating layer.

2. The solar cell according to claim 1, wherein the conductive seeds contain silver.

3. The solar cell according to claim 1, wherein the electrically insulating layer is optically transparent.

4. The solar cell according to claim 1, wherein the electrically insulating layer comprises one layer or a stack of layers made of materials selected from the group consisting of MgF, silicon nitride, ZnS, $TiO_2$, $SiO_2$, silicon oxynitride and $Al_2O_3$.

5. The solar cell according to claim 1, wherein the plating layer is made of a material selected from the group consisting of Ag and Cu.

6. The solar cell according to claim 1, wherein the electrical contacts form a pattern designed for current collection.

7. The solar cell according to claim 1, wherein said solar cell is a silicon heterojunction solar cell.

8. The solar cell according to claim 1, wherein the openings are formed in a portion of the electrically insulating layer that covers the conductive seeds.

* * * * *